United States Patent
Chung et al.

(10) Patent No.: US 7,348,274 B2
(45) Date of Patent: Mar. 25, 2008

(54) METHOD OF ALIGNING CARBON NANOTUBES AND METHOD OF MANUFACTURING FIELD EMISSION DEVICE USING THE SAME

(75) Inventors: Deuk-Seok Chung, Seongnam-si (KR); Tae-Sik Oh, Suwon-si (KR); Min-Jong Bae, Anyang-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 258 days.

(21) Appl. No.: 11/225,174

(22) Filed: Sep. 14, 2005

(65) Prior Publication Data
US 2007/0238272 A1    Oct. 11, 2007

(30) Foreign Application Priority Data
Sep. 14, 2004    (KR) ................ 10-2004-0073364

(51) Int. Cl.
    *H01L 21/44*    (2006.01)
(52) U.S. Cl. .............. 438/679; 438/681; 977/742; 977/745; 427/248.1; 427/249.1
(58) Field of Classification Search ............ 438/681, 438/679; 117/89; 177/104; 977/742, 745, 977/748, 756
See application file for complete search history.

(56) References Cited

U.S. PATENT DOCUMENTS

| 6,924,335 | B2* | 8/2005 | Fan et al. ............... 524/495 |
| 2003/0096104 | A1* | 5/2003 | Tobita et al. ............ 428/332 |
| 2004/0173506 | A1* | 9/2004 | Doktycz et al. ......... 210/85 |

* cited by examiner

*Primary Examiner*—Hsien-Ming Lee
*Assistant Examiner*—Su C. Kim
(74) *Attorney, Agent, or Firm*—Robert E. Bushnell, Esq.

(57) ABSTRACT

A method of aligning carbon nanotubes (CNTs) and a method of manufacturing a field emission device (FED) using the same, wherein a mold having an intaglio pattern is prepared, an aqueous solution containing an amphiphilic organic material and the CNTs are coated on a surface of a substrate, the mold is adhered to the substrate surface to cause the aqueous solution to flow into the intaglio pattern by a capillary force, and the mold is removed from the substrate surface to vertically align the CNTs on the substrate surface.

47 Claims, 4 Drawing Sheets

METHOD OF ALIGNING CARBON NANOTUBES AND METHOD OF MANUFACTURING FIELD EMISSION DEVICE USING THE SAME

CLAIM OF PRIORITY

This application claims the benefit of Korean Patent Application No. 10-2004-0073364, filed on Sep. 14, 2004, in the Korean Intellectual Property Office, the disclosure of which is incorporated herein in its entirety by reference.

BACKGROUND OF THE INVENTION

1. Field of the Invention

The present invention relates to a method of aligning carbon nanotubes (CNTs) and a method of manufacturing a field emission device (FED) using the same.

2. Description of the Related Art

In an FED, electrons are emitted from emitters formed on a cathode. Recently, emitters composed of CNTs have been widely used in FEDs. CNTs have excellent electron-emitting properties and chemical and mechanical durability and research on their physical properties, and applicability is constantly being conducted.

Conventionally, a carbon nanotube emitter is formed using a chemical vapor deposition (CVD) method in which carbon nanotubes are directly grown on a substrate or a method in which a paste containing CNTs and resins are used. However, the CVD method requires a high temperature process, and thus, cannot be applied to a glass substrate, and the latter method cannot provide a good alignment of CNTs.

It is important that CNTs be vertically aligned on a cathode when forming CNT emitters, since a discharge current varies according to a state of alignment of the CNTs.

SUMMARY OF THE INVENTION

It is therefore an object of the present invention to provide an improved method for vertically aligning carbon nanotubes.

It is also an object of the present invention to provide an improved method of manufacturing a field emission device.

The present invention provides a method of vertically aligning carbon nanotubes (CNTs) on a substrate using the Langmuir-Blodgett method, which is a method of forming organic materials in a thin film and a capillary force generated in a polydimethylsiloxane (PDMS) mold, which is used in micro-contact printing.

The present invention also provides a method of manufacturing a field emission device (FED) using the above aligning method.

According to an aspect of the present invention, there is provided a method of aligning CNTs, comprising: preparing a mold having an intaglio pattern; coating an aqueous solution containing an amphiphilic organic material and the CNTs on a surface of a substrate; positioning the mold on the substrate surface to cause the aqueous solution to flow into the intaglio pattern due to a capillary force; and removing the mold from the substrate surface to vertically align the CNTs on the substrate surface.

The method may further comprise aligning organic molecules which compose the organic material and are attached to the CNTs, after the coating step.

The mold may be a PDMS mold.

The preparation of the mold may comprise: forming a master having a nanoscale embossed pattern matching the intaglio pattern using a lithographic process; coating PDMS on the master and curing the coated PDMS; and separating the cured PDMS from the master to form the mold. The method may further comprise surface-treating the mold such that the mold has a hydrophobic surface. The mold may be surface-treated with $CF_4$ plasma.

The substrate may have a hydrophilic surface. The substrate may be a glass substrate. In this case, a conductive polymethylmethacrylate (PMMA) may be coated on the substrate surface.

The aqueous solution may comprise a hydrophilic solvent. The CNTs may be amphiphilic CNTs.

Lateral sides of the CNTs in the aqueous solution may be attached to hydrophilic radicals of organic molecules composing the organic material. The aqueous solution may further comprise a thermally curable organic material.

In the causing the aqueous solution to flow into the intaglio pattern, hydrophobic radicals of the organic molecules may be attached to inner walls of the intaglio pattern.

In the vertically aligning the CNTs, one end of each of the CNTs may be vertically attached to the substrate surface.

According to another aspect of the present invention, there is provided a method of aligning CNTs, comprising: preparing a mold having an intaglio pattern; preparing an aqueous solution containing an amphiphilic organic material and the CNTs; dipping the mold into the aqueous solution to cause the aqueous solution to flow into the intaglio pattern due to a capillary force; positioning the mold on a surface of a substrate; and removing the mold from the substrate surface to vertically align the CNTs on the substrate surface.

The method may comprise aligning organic molecules which compose the organic material and are attached to the CNTs, after the preparation of the aqueous solution. The mold may be disposed perpendicularly to the surface of the aqueous solution when the mold is dipped into the aqueous solution.

According to still another aspect of the present invention, there is provided a method of manufacturing a field emission device (FED), comprising: preparing a mold having an intaglio pattern; coating an aqueous solution containing an amphiphilic organic material and amphiphilic CNTs on a surface of a cathode formed on a substrate; positioning the mold on the surface of the cathode to cause the aqueous solution to flow into the intaglio pattern due to a capillary force; and removing the mold from the surface of the cathode to vertically align the CNTs on the surface of the cathode.

According to yet another aspect of the present invention, there is provided a method of manufacturing an FED, comprising: preparing a mold having an intaglio pattern; preparing an aqueous solution containing an amphiphilic organic material and amphiphilic CNTs; dipping the mold into the aqueous solution to cause the aqueous solution to flow into the intaglio pattern due to a capillary force; positioning the mold on a surface of a cathode formed on a substrate surface; and removing the mold from the surface of the cathode to vertically align the CNTs on the surface of the cathode.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
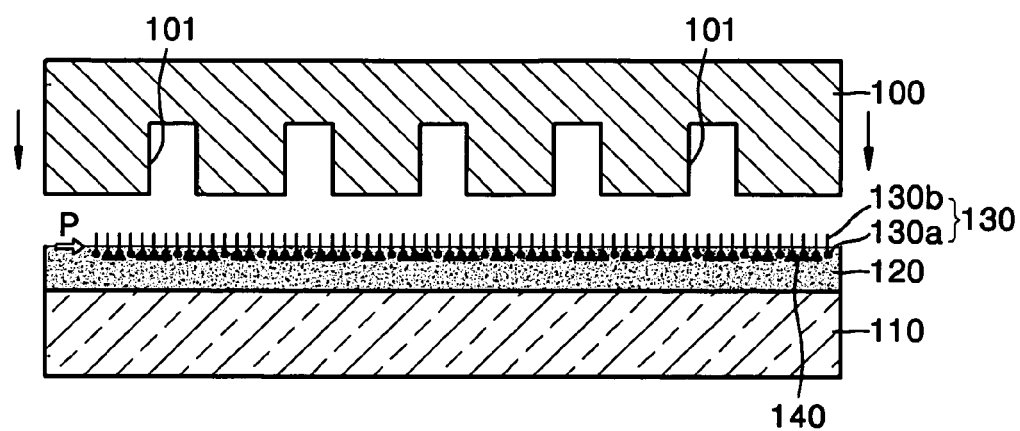
FIGS. 1 through 4 are cross-sectional views illustrating a method of aligning carbon nanotubes (CNTs) according to an embodiment of the present invention.

Hereinafter, the present invention will be described in more detail with reference to the following exemplary examples. Throughout the drawings, like reference numerals refer to like elements and the sizes and thicknesses of elements are exaggerated for clarity The present invention provides a method of vertically aligning carbon nanotubes (CNTs) on a substrate using the Langmuir-Blodgett method, which is a method of forming organic materials in a thin film, and a capillary force generated in a mold, preferably a polydimethylsiloxane (PDMS) mold, which is used in micro-contact printing.

Figure 2:
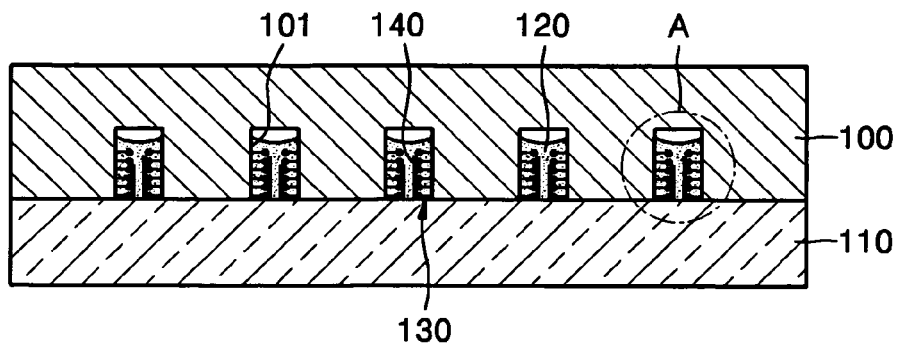
Figure 3:
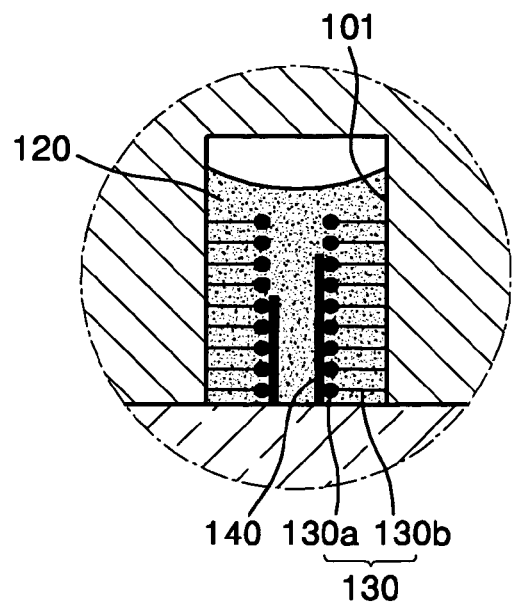

FIGS. 1 through 4 are cross-sectional views illustrating a method of aligning CNTs according to an embodiment of the present invention. FIG. 3 is an enlarged view of a portion A illustrated in FIG. 2.

Referring to FIG. 1, a PDMS mold 100 having a nanoscale intaglio pattern 101 is prepared. The PDMS mold 100 has a hydrophobic surface. The PDMS mold 100 is a mold generally used in micro-contact printing. To prepare the PDMS mold 100, a photoresist is coated on a substrate, such as a silicon wafer, to a predetermined thickness and patterned using a lithographic process to obtain a master having a nanoscale embossed pattern. Then, a soft PDMS is coated on the master and is cured. Subsequently, the cured PDMS is separated from the master, leaving the PDMS mold 100 having the intaglio pattern 101, which matches the embossed pattern. When the PDMS mold 100 is surface-treated with $CF_4$ plasma, etc., the PDMS mold 100 has a hydrophobic surface.

Next, an aqueous solution 120 containing an amphiphilic organic material and CNTs 140 in a hydrophilic solvent is coated on a surface of a substrate 110. The amphiphilic organic material is comprised of an organic molecule 130 having a hydrophilic radical 130a and a hydrophobic radical 130b. The CNTs 140 contained in the aqueous solution 120 may be amphiphilic CNTs having hydrophilic lateral sides and hydrophobic ends. Thus, the organic molecules 130 are located on a surface of the aqueous solution 120, and the lateral sides of the CNTs 140 in the aqueous solution 120 are attached to hydrophilic radicals 130a of the organic molecules 130. The aqueous solution 120 may further comprise a thermally curable organic material such that the CNTs 140 can be easily attached to the organic molecules 130.

The substrate 110 may be a glass substrate and is surface-treated to have a hydrophilic surface. Meanwhile, a conductive polymethylmethacrylate (PMMA), etc. may be coated on the surface of the substrate 110 such that the substrate 110 may be used in a general device.

Next, the CNTs 140 and the organic molecules 130 located on the surface of the aqueous solution 120 are aligned. The alignment of the organic molecules 130 and the CNTs 140 is performed using the Langmuir-Blodgett method. That is, a pressure P is applied to the organic molecules 130 in a direction parallel to the surface of the aqueous solution 120, and thus the organic molecules 130 having the CNTs 140 attached thereto are vertically aligned on the surface of the aqueous solution 120.

Referring to FIGS. 2 and 3, the PDMS mold 100 is attached closely to the surface of the substrate 110 by applying pressure, thus causing the aqueous solution 120 to flow into the intaglio pattern 101 due to a capillary force. Since the PDMS mold 100 has a hydrophobic surface, the hydrophobic radicals 130b of the organic molecules 130 are attached to inner walls of the intaglio pattern 101. During this process, one end of each of the CNTs 140, lateral sides of which are attached to the hydrophilic radicals 130a of the organic molecules 130, is attached to the surface of the substrate 110.

Figure 4:
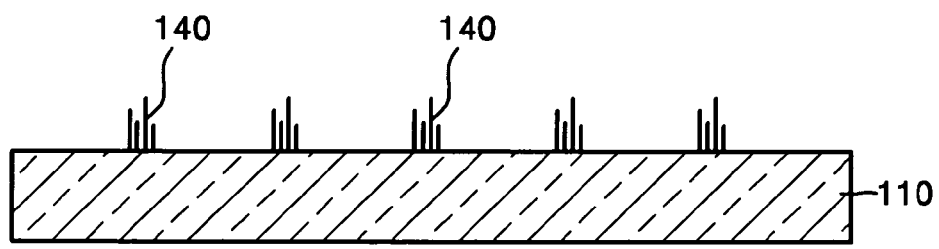

Then, the PDMS mold 100 is removed from the surface of the substrate 110 to vertically align the CNTs 140 on the surface of the substrate 110, as illustrated in FIG. 4.

As described above, the CNTs 140 can be vertically aligned on the substrate 110 by using the Langmuir-Blodgett method, which is a method of forming organic materials in a thin film, and a capillary force generated in the PDMS mold 100, which is used in micro-contact printing.

Figure 5:
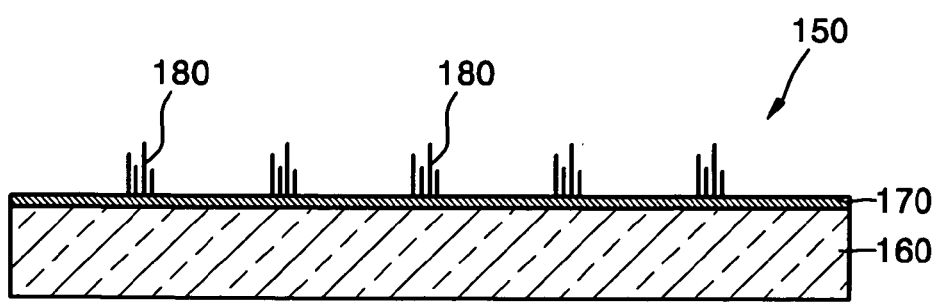
FIG. 5 is a cross-sectional view of a field emission device (FED) manufactured using a method of manufacturing an FED according to an embodiment of the present invention.

The above process can be used to manufacture an FED 150 illustrated in FIG. 5. That is, by performing the above process using a substrate 160 on which a cathode 170 is formed, the FED 150, which includes CNT emitters 180 vertically aligned on a surface of the cathode 170 can be manufactured. An explanation of the manufacturing process of the FED 150 will be omitted since it is the same as the above process.

Figure 6:
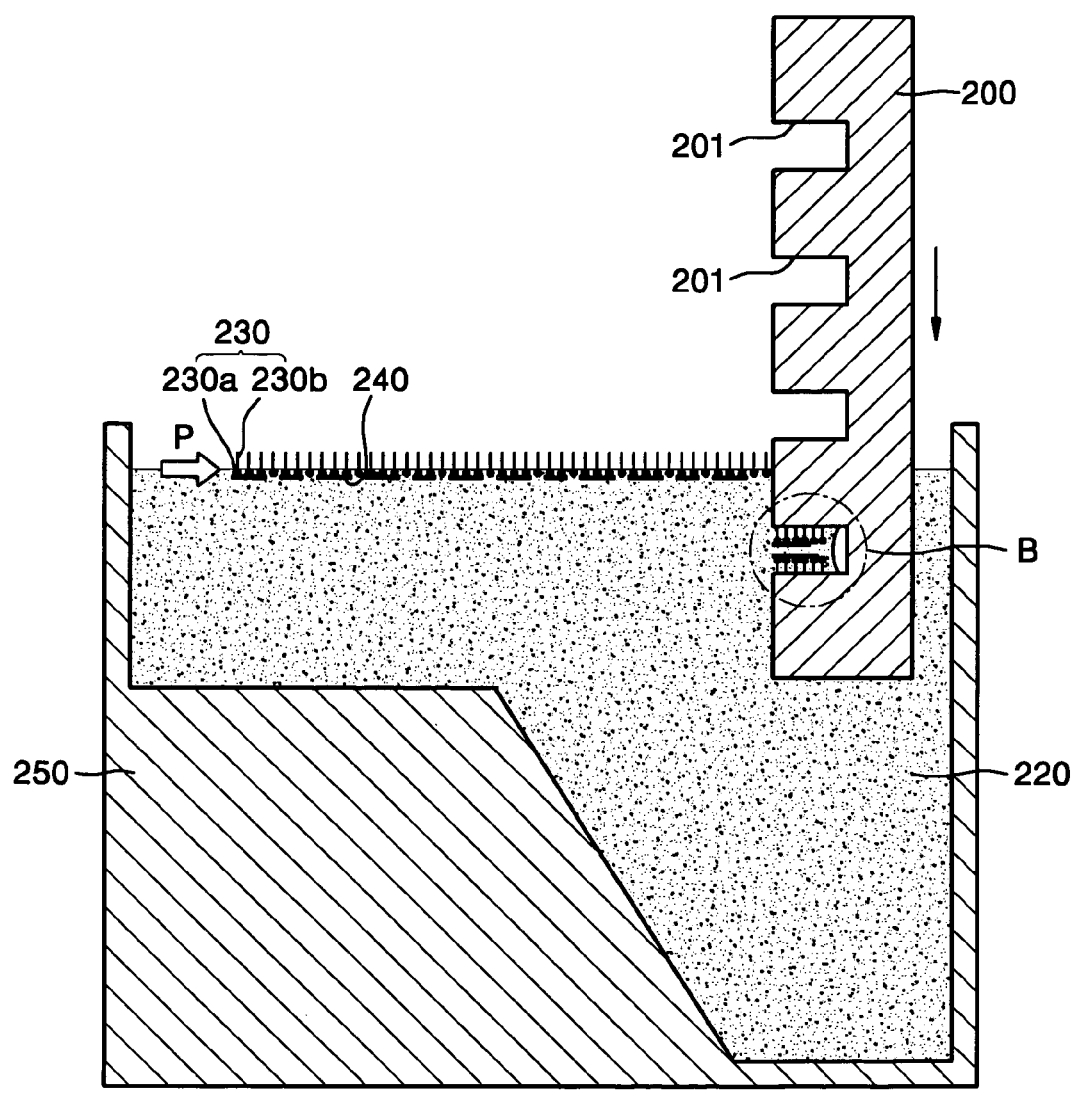
FIGS. 6 through 9 are cross-sectional views illustrating a method of aligning CNTs according to another embodiment of the present invention.
Figure 7:
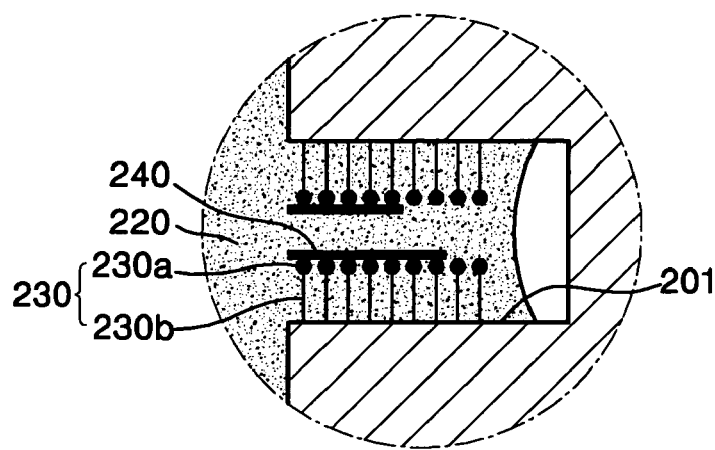

FIGS. 6 through 9 are views illustrating a method of aligning CNTs according to another embodiment of the present invention. FIG. 7 is an enlarged view of a portion B illustrated in FIG. 6.

Referring to FIGS. 6 and 7, a PDMS mold 200 having a nanoscale intaglio pattern 201 is prepared. The PDMS mold 200 has a hydrophobic surface. A detailed explanation of a process of preparing the PDMS mold 200 will be omitted since it is the same as the process of preparing the PDMS mold 100.

Next, an aqueous solution 220 containing an amphiphilic organic material and CNTs 240 in a hydrophilic solvent is prepared in a container 250. The amphiphilic organic material is comprised of an organic molecule 230 having a hydrophilic radical 230a and a hydrophobic radical 230b. The CNTs 240 contained in the aqueous solution 220 may be amphiphilic CNTs having hydrophilic lateral sides and hydrophobic ends. Thus, the organic molecules 230 are located on a surface of the aqueous solution 220 and the lateral sides of the CNTs 240 in the aqueous solution 220 are attached to hydrophilic radicals 230a of the organic molecules 230. The aqueous solution 220 may further comprise a thermally curable organic material such that the CNTs 240 can be easily attached to the organic molecules 230.

Next, the CNTs 240 and the organic molecules 230 located on the surface of the aqueous solution 220 are aligned. The alignment of the organic molecules 230 and the CNTs 240 is performed using the Langmuir-Blodgett method. That is, a pressure P is applied to the organic molecules 230 in a direction parallel to the surface of the aqueous solution 220, and thus the organic molecules 230 having the CNTs 240 attached thereto are vertically aligned on to the surface of the aqueous solution 220.

Subsequently, the PDMS mold 200 is dipped into the aqueous solution 220 such that the PDMS mold 200 is positioned perpendicularly to the surface of the aqueous solution 220, thus causing the aqueous solution 220 to flow into the intaglio pattern 201 of the PDMS mold 200 due to a capillary force, as illustrated in FIG. 6. Since the PDMS mold 200 has a hydrophobic surface, the hydrophobic radicals 230b of the organic molecules 230 are attached to the inner walls of the intaglio pattern 201.

Figure 8:
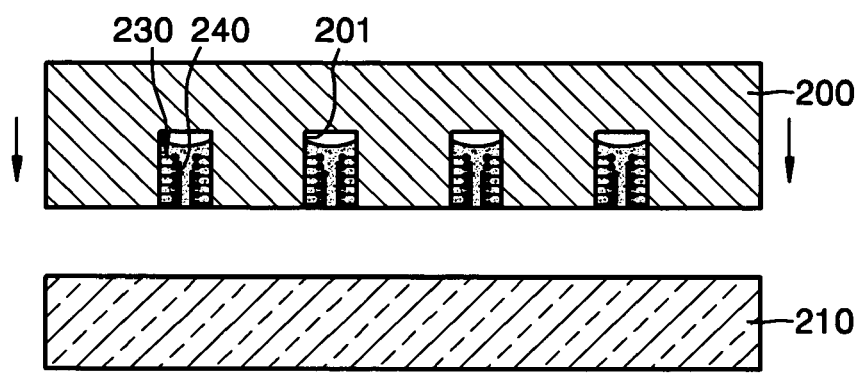

Referring to FIG. 8, when the PDMS mold 200 adheres to the surface of the substrate 210, one end of each of the CNTs 240, lateral sides of which are attached to the hydrophilic radicals 230a of the organic molecules 230, is attached to the surface of the substrate 210. The substrate 210 may be a glass substrate and is surface-treated to have a hydrophilic surface. A conductive PMMA, etc. may be coated on the surface of the substrate 210 such that the substrate 210 may be used in a general device.

Figure 9:
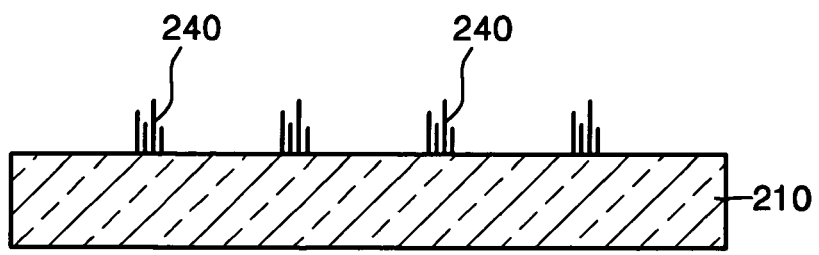

Then, the PDMS mold 200 is removed from the surface of the substrate 210 to vertically align the CNTs 240 on the surface of the substrate 210, as illustrated in FIG. 9.

The above process can be used to manufacture the FED 150 illustrated in FIG. 5. That is, by performing the above process using a substrate 160 on which a cathode 170 is formed, the FED 150, which includes CNT emitters 180 vertically aligned on a surface of the cathode 170, can be manufactured. An explanation of the manufacturing process of the FED 150 will be omitted since it is the same as the above process.

As described above, according to the present invention, CNTs can be vertically aligned on a substrate using the Langmuir-Blodgett method, which is a method of forming organic materials in a thin film, and a capillary force generated in a PDMS mold, which is used in micro-contact printing. Thus, an FED having excellent field emission properties can be manufactured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of aligning carbon nanotubes, comprising:
   preparing a mold having an intaglio pattern;
   coating an aqueous solution containing an amphiphilic organic material and the carbon nanotubes on a surface of a substrate;
   positioning the mold on the substrate surface to cause the aqueous solution to flow into the intaglio pattern due to a capillary force; and
   removing the mold from the substrate surface to vertically align the carbon nanotubes on the substrate surface.

2. The method of claim 1, further comprising vertically aligning the organic material attached to the carbon nanotubes, after the coating step.

3. The method of claim 1, wherein the mold is a polydimethylsiloxane (PDMS) mold.

4. The method of claim 3, wherein the preparation of the mold comprises:
   forming a master having a nanoscale embossed pattern matching the intaglio pattern using a lithographic process;
   coating polydimethylsiloxane on the master and curing the coated polydimethylsiloxane; and
   separating the cured polydimethylsiloxane from the master to form the mold.

5. The method of claim 4, further comprising surface-treating the mold to make the surface of the mold hydrophobic.

6. The method of claim 5, wherein the mold is surface-treated with CF4 plasma.

7. The method of claim 1, wherein the substrate has a hydrophilic surface.

8. The method of claim 7, wherein the substrate is a glass substrate.

9. The method of claim 8, wherein a conductive polymethylmethacrylate is coated on the substrate surface.

10. The method of claim 1, wherein the aqueous solution comprises the amphiphilic organic material and the carbon nanotubes in a hydrophilic solvent.

11. The method of claim 10, wherein the carbon nanotubes are amphiphilic.

12. The method of claim 11, wherein the amphiphilic organic material comprises an organic molecule having a hydrophilic radical and a hydrophobic radical, each of the carbon nanotubes has a hydrophilic lateral side and hydrophilic ends, and the mold has a hydrophobic surface so that the lateral sides of the carbon nanotubes are attached to the hydrophilic radical of the organic molecule in the aqueous solution during the coating step and the positioning step, and the hydrophobic radical of the organic molecule is attached to an inner wall of the intaglio pattern during the positioning step.

13. The method of claim 12, wherein the aqueous solution further comprises a thermally curable organic material.

14. A method of aligning carbon nanotubes, comprising:
   preparing a mold having an intaglio pattern;
   preparing an aqueous solution containing an amphiphilic organic material and carbon nanotubes;
   dipping the mold into the aqueous solution to cause the aqueous solution to flow into the intaglio pattern due to a capillary force;
   positioning the mold on a surface of a substrate; and
   removing the mold from the substrate surface to vertically align the carbon nanotubes on the substrate surface.

15. The method of claim 14, further comprising vertically aligning the organic material attached to the carbon nanotubes, after the preparation of the aqueous solution.

16. The method of claim 14, wherein the mold is disposed perpendicularly to the surface of the aqueous solution when the mold is dipped into the aqueous solution.

17. The method of claim 14, wherein the mold is a polydimethylsiloxane mold.

18. The method of claim 17, wherein the preparation of the mold comprises:
   forming a master having a nanoscale embossed pattern matching the intaglio pattern using a lithographic process;
   coating polydimethylsiloxane (PDMS) on the master and curing the coated polydimethylsiloxane; and
   separating the cured PDMS from the master to form the mold.

19. The method of claim 18, further comprising surface-treating the mold to make the surface of the mold hydrophobic.

20. The method of claim 19, wherein the mold is surface-treated with CF4 plasma.

21. The method of claim 18, wherein the substrate includes an electrode, and the carbon nanotubes are vertically aligned on the surface of the electrode, and the carbon nanotubes constitute emitters of a field emission device.

22. The method of claim 18, comprised of:
coating the aqueous solution onto the surface of the substrates by dipping the mold into the aqueous solution, and
positioning the mold on the substrate to cause the aqueous solution to flow into the intaglio pattern due to a capillary force.

23. The method of claim 14, wherein the substrate has a hydrophilic surface.

24. The method of claim 23, wherein the carbon nanotubes are amphiphilic carbon nanotubes.

25. The method of claim 24, wherein the amphiphilic organic material comprises an organic molecule having a hydrophilic radical and a hydrophobic radical, each of the carbon nanotubes has a hydrophilic lateral side and hydrophilic ends, and the mold has a hydrophobic surface so that the lateral sides of the carbon nanotubes are attached to the hydrophilic radical of the organic molecule in the aqueous solution during the preparation of the aqueous solution and the dipping step, and the hydrophobic radical of the organic molecule is attached to an inner wall of the intaglio pattern during the dipping step and the positioning step.

26. The method of claim 25, wherein the aqueous solution further comprises a thermally curable organic material.

27. The method of claim 14, wherein the substrate has a hydrophilic surface.

28. The method of claim 27, wherein the substrate is a glass substrate.

29. The method of claim 28, wherein a conductive polymethylmethacrylate is coated on the substrate surface.

30. A method of manufacturing a field emission device (FED), comprising:
preparing a mold having an intaglio pattern;
coating an aqueous solution containing an amphiphilic organic material and amphiphilic carbon nanotubes on a surface of an electrode formed on a substrate;
positioning the mold on the surface of the electrode to cause the aqueous solution to flow into the intaglio pattern due to a capillary force; and
removing the mold from the surface of the electrode to vertically align the carbon nanotubes on the surface of the electrode.

31. The method of claim 30, further comprising vertically aligning the organic material attached to the carbon nanotubes, after the coating step.

32. The method of claim 30, wherein the mold is a polydimethylsiloxane mold having a hydrophobic surface.

33. The method of claim 30, wherein the electrode is a cathode.

34. The method of claim 30, wherein the amphiphilic organic material comprises an organic molecule having a hydrophilic radical and a hydrophobic radical, each of the carbon nanotubes has a hydrophilic lateral side and hydrophilic ends, and the mold has a hydrophobic surface so that the lateral sides of the carbon nanotubes are attached to the hydrophilic radical of the organic molecule in the aqueous solution, and the hydrophobic radical of the organic molecule is attached to an inner wall of the intaglio pattern during the positioning step.

35. A method of manufacturing an FED, comprising:
preparing a mold having an intaglio pattern;
preparing an aqueous solution containing an amphiphilic organic material and amphiphilic carbon nanotubes;
dipping the mold into the aqueous solution to cause the aqueous solution to flow into the intaglio pattern due to a capillary force;
positioning the mold on a surface of an electrode formed on a substrate surface; and
removing the mold from the surface of the electrode to vertically align the carbon nanotubes on the surface of the electrode.

36. The method of claim 35, further comprising vertically aligning organic material attached to the carbon nanotubes, after the preparation of the aqueous solution.

37. The method of claim 35, wherein the mold is disposed perpendicularly to the surface of the aqueous solution when the mold is dipped into the aqueous solution.

38. The method of claim 35, wherein the mold is a polydimethylsiloxane mold having a hydrophobic surface.

39. The method of claim 35, wherein the amphiphilic organic material comprises an organic molecule having a hydrophilic radical and a hydrophobic radical, each of the carbon nanotubes has a hydrophilic lateral side and hydrophilic ends, and the mold has a hydrophobic surface so that the lateral sides of the carbon nanotubes are attached to the hydrophilic radical of the organic molecule in the aqueous solution during the preparation of the aqueous solution and the dipping step, and the hydrophobic radical of the organic molecule is attached to an inner wall of the intaglio pattern during the dipping step and the positioning step.

40. The method of claim 35, wherein the electrode is a cathode.

41. The method of claim 39, comprised of:
positioning the mold on the substrate surface to cause the aqueous solution to flow into the intaglio pattern due to a capillary force, before
removing the mold from the substrate surface to vertically align the carbon nanotubes on the substrate surface.

42. The method of claim 39, wherein the substrate includes an electrode, and the carbon nanotubes are vertically aligned on the surface of the electrode, and the carbon nanotubes constitute emitters of a field emission device.

43. A method of aligning carbon nanotubes, comprising:
preparing a mold having an intaglio pattern;
preparing an aqueous solution containing an amphiphilic organic material and the carbon nanotubes;
positioning the mold to cause the aqueous solution to flow into the intaglio pattern due to a capillary force; and
separating the carbon nanotubes from the mold to vertically align the carbon nanotubes.

44. The method of claim 43, wherein the preparation of the aqueous solution comprises coating the aqueous solution on a substrate, the positioning step comprises positioning the mold on the substrate, and the separating step comprises removing the mold from the substrate.

45. The method of claim 44, wherein the substrate includes an electrode, and the carbon nanotubes are vertically aligned on the surface of the electrode, and the manufactured carbon nanotubes constitute emitters of a field emission device.

46. The method of claim 43, wherein the positioning step comprises dipping the mold into the aqueous solution, and the separating step comprises positioning the mold on a substrate and removing the mold from the substrate.

47. The method of claim 46, wherein the substrate includes an electrode, and the carbon nanotubes are vertically aligned on the surface of the electrode, and the manufactured carbon nanotubes constitute emitters of a field emission device.

* * * * *